(12) United States Patent
Liu

(10) Patent No.: US 7,479,780 B2
(45) Date of Patent: Jan. 20, 2009

(54) TESTER FOR IN-CIRCUIT TESTING BED OF NAILS FIXTURE AND TESTING CIRCUIT THEREOF

(75) Inventor: Jin-Peng Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 164 days.

(21) Appl. No.: 11/309,274

(22) Filed: Jul. 21, 2006

(65) Prior Publication Data

US 2007/0075713 A1    Apr. 5, 2007

(30) Foreign Application Priority Data

Sep. 23, 2005   (CN)   ................... 2005 1 0037496

(51) Int. Cl.
*G01R 31/02* (2006.01)
*G01R 31/26* (2006.01)

(52) U.S. Cl. .................... 324/158.1; 324/754; 324/756; 324/761

(58) Field of Classification Search ......... 324/754–765, 324/158.1
See application file for complete search history.

(56) References Cited

U.S. PATENT DOCUMENTS 4,841,231 A * 6/1989 Angelucci .................. 324/528
5,270,641 A * 12/1993 Van Loan et al. ........... 324/757
5,469,064 A * 11/1995 Kerschner et al. .......... 324/537
5,933,019 A * 8/1999 Depue ........................ 324/761
6,894,479 B2 * 5/2005 Siefers et al. ............ 324/158.1
2007/0030011 A1 * 2/2007 Wu ............................ 324/539

FOREIGN PATENT DOCUMENTS

CN           2159029 Y       3/1994
CN           00200774.6      6/2001

* cited by examiner

Primary Examiner—Ha Tran T Nguyen
Assistant Examiner—Emily Y Chan
(74) Attorney, Agent, or Firm—Wei Te Chung

(57) ABSTRACT

In one preferred embodiment, a tester for testing an In-Circuit Testing (ICT) bed of nails fixture includes an interface for connecting a cable, wherein the cable is connected to the ICT bed of nails fixture; a probe connected to one of nails of the ICT bed of nails fixture, wherein the probe is grounded; a display device for displaying a number according with a pin of the interface, wherein the pin is connected to the probe through the cable and the one of the nails of the ICT bed of nails; a testing circuit electrically connected to the display device and the interface for testing continuity of the ICT bed of nails fixture; and a power supply providing voltages to the testing circuit. The tester is small enough to be conveniently moved. Thus, testing of the ICT bed of nails fixture may be easily carried out.

11 Claims, 5 Drawing Sheets

TESTER FOR IN-CIRCUIT TESTING BED OF NAILS FIXTURE AND TESTING CIRCUIT THEREOF

FIELD OF THE INVENTION

The present invention relates generally to test equipment and more specifically to a tester for testing performance of an In-Circuit Testing (ICT) bed of nails fixture, and a testing circuit thereof.

DESCRIPTION OF RELATED ART

In electrical device manufacturing, it is necessary to make frequent checks verifying the integrity of connections, such as opens and shorts. Usually, ICT equipment is connected with a bed of nails fixture by a cable for in-circuit testing of electrical devices, such as motherboards. Before testing the electrical devices, the bed of nails fixture should be tested for proper performance. Thus, it can be sure that faults found during testing are due to the electrical devices. It is typical to employ the ICT equipment to test the bed of nails fixture.

However, the ICT equipment and the bed of nails fixture may be located too far apart from each other for convenient and accurate testing of the bed of nails, but are too large to be moved.

What is desired, therefore, is a portable tester for testing bed of nails fixtures.

SUMMARY OF THE INVENTION

In one preferred embodiment, a tester for testing an In-Circuit Testing (ICT) bed of nails fixture includes an interface for connecting a cable, wherein the cable is connected to the ICT bed of nails fixture; a probe connected to one of nails of the ICT bed of nails fixture, wherein the probe is grounded; a display device for displaying a number according with a pin of the interface, wherein the pin is connected to the probe through the cable and the one of the nails of the ICT bed of nails; a testing circuit electrically connected to the display device and the interface for testing continuity of the ICT bed of nails fixture; and a power supply providing voltages to the testing circuit.

Other advantages and novel features will become more apparent from the following detailed description when taken in conjunction with the accompanying drawings, in which:

DETAILED DESCRIPTION OF THE INVENTION

Figure 1:
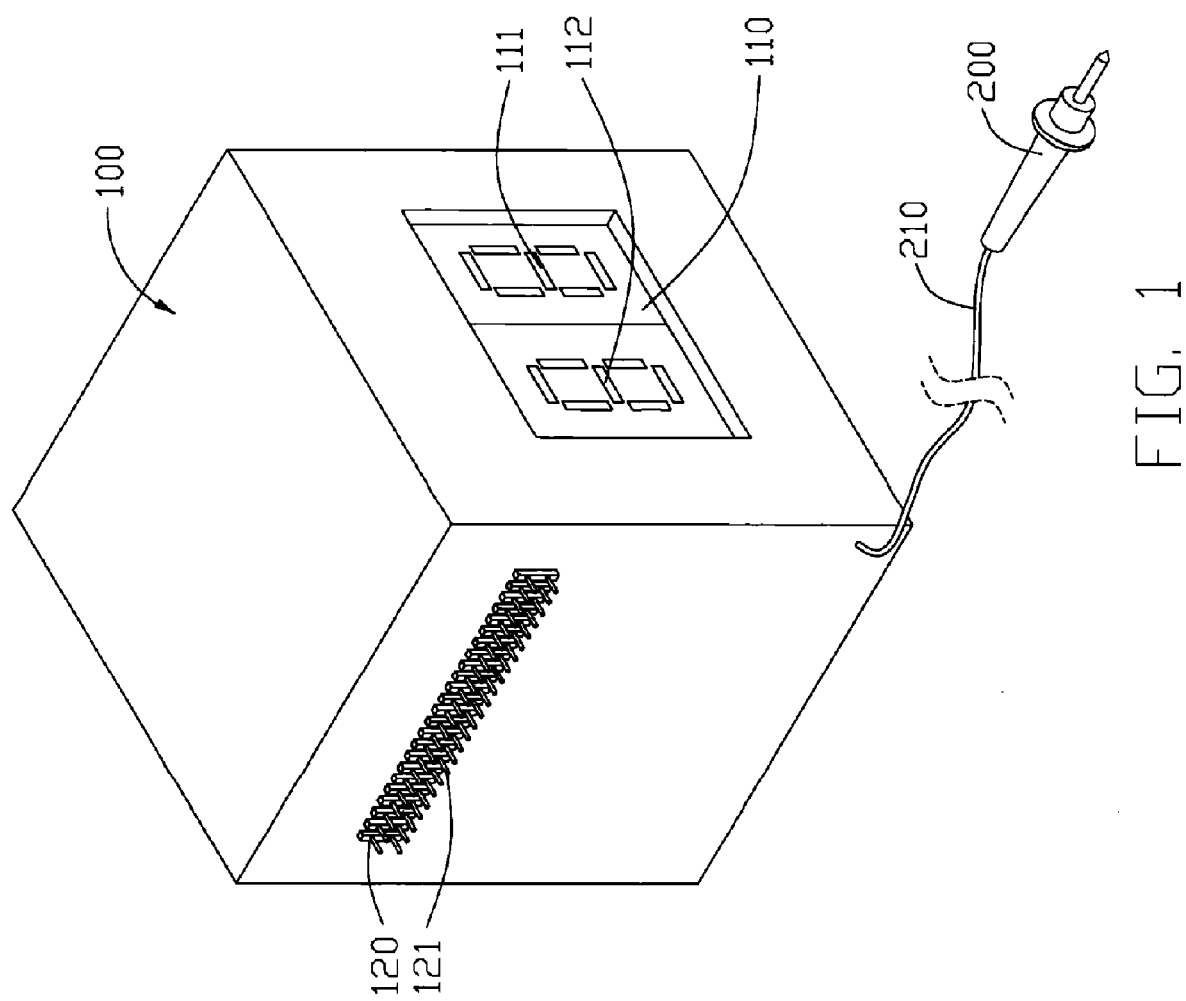
FIG. 1 is a schematic view of a tester of a preferred embodiment of the present invention.
Figure 2:
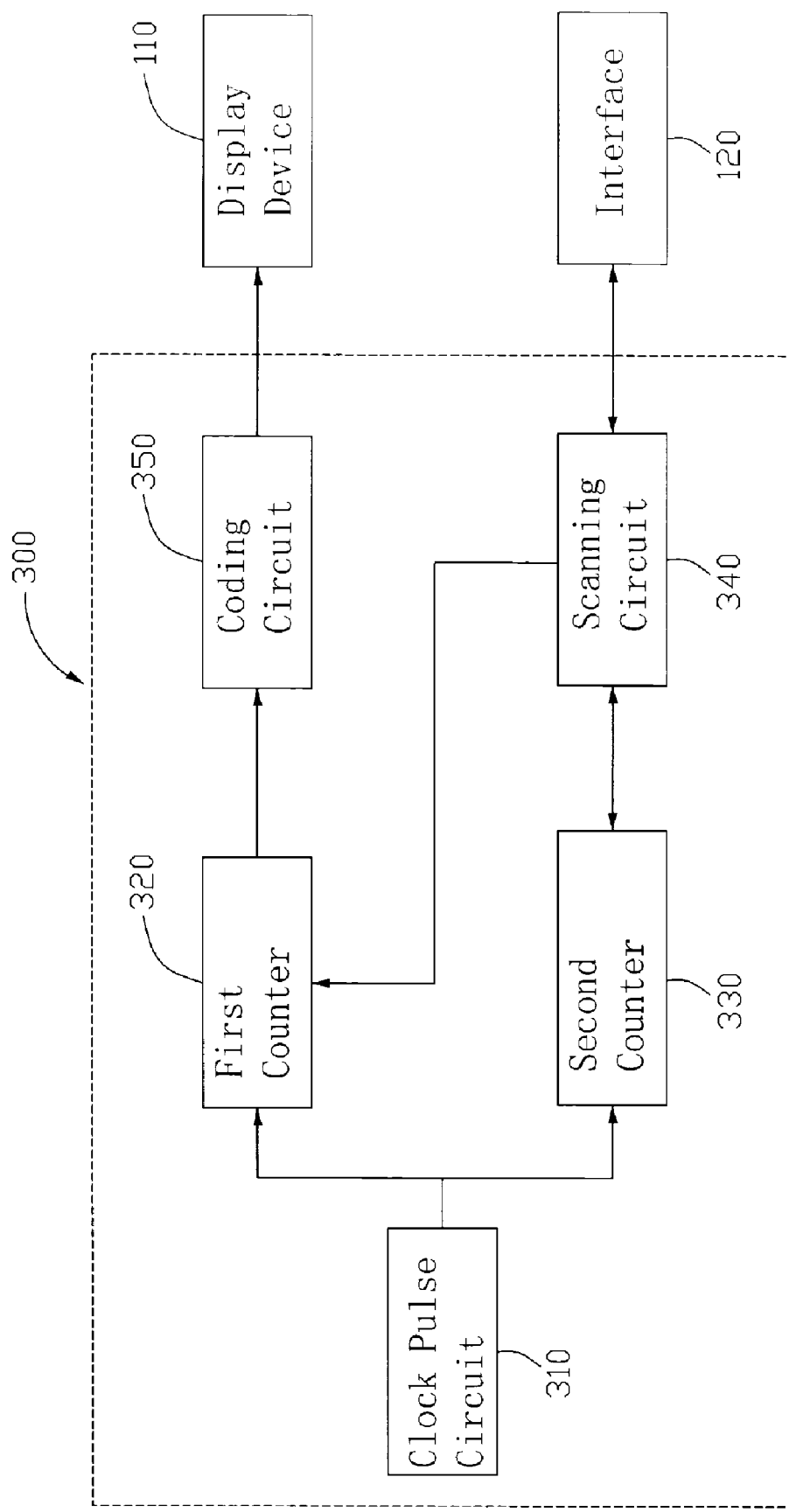
FIG. 2 is a block diagram of a testing circuit of the tester of FIG. 1.
Figure 3:
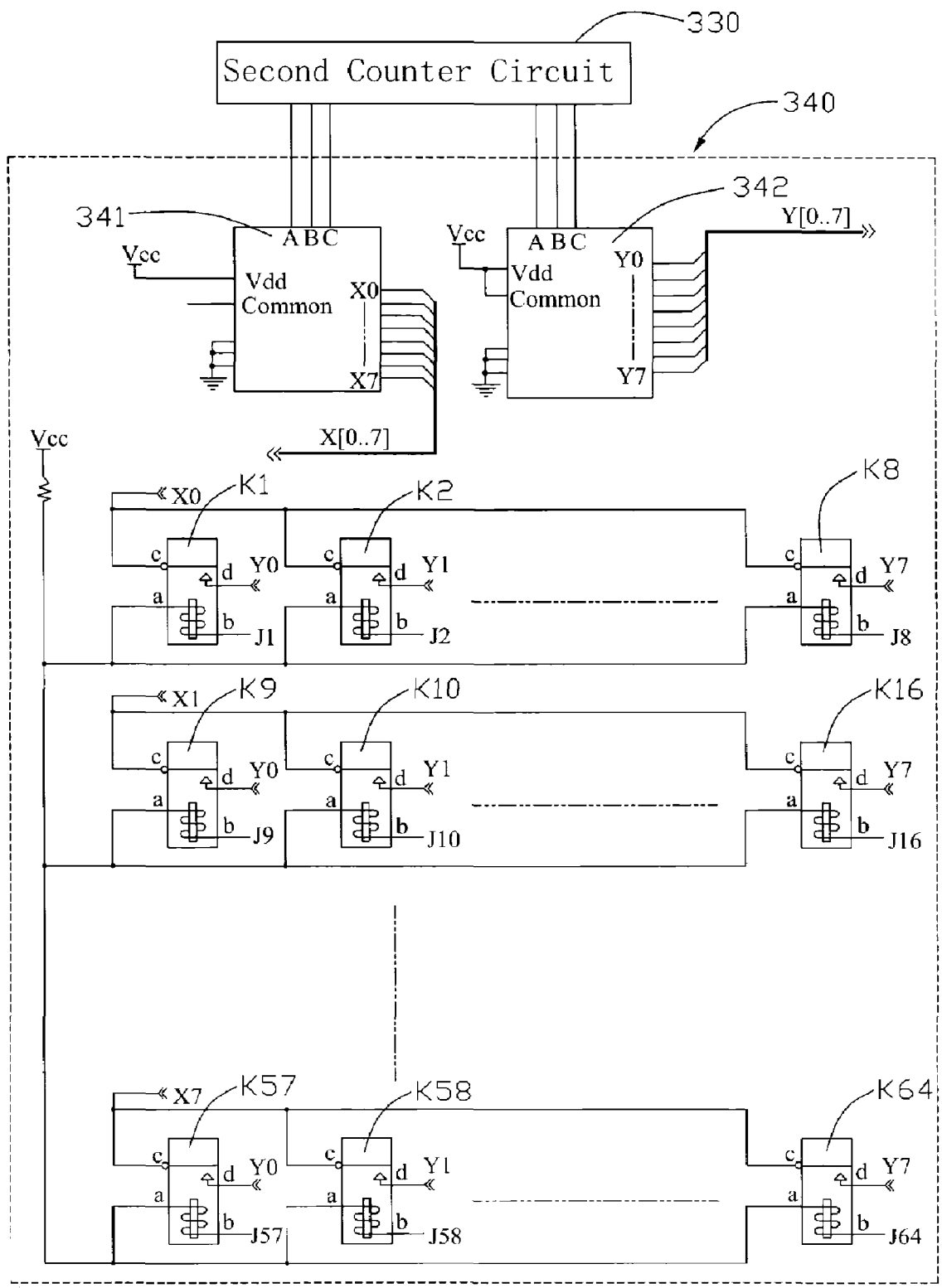
FIG. 3 is a circuit diagram of a second counter and a scan circuit of FIG. 2.
Figure 4:
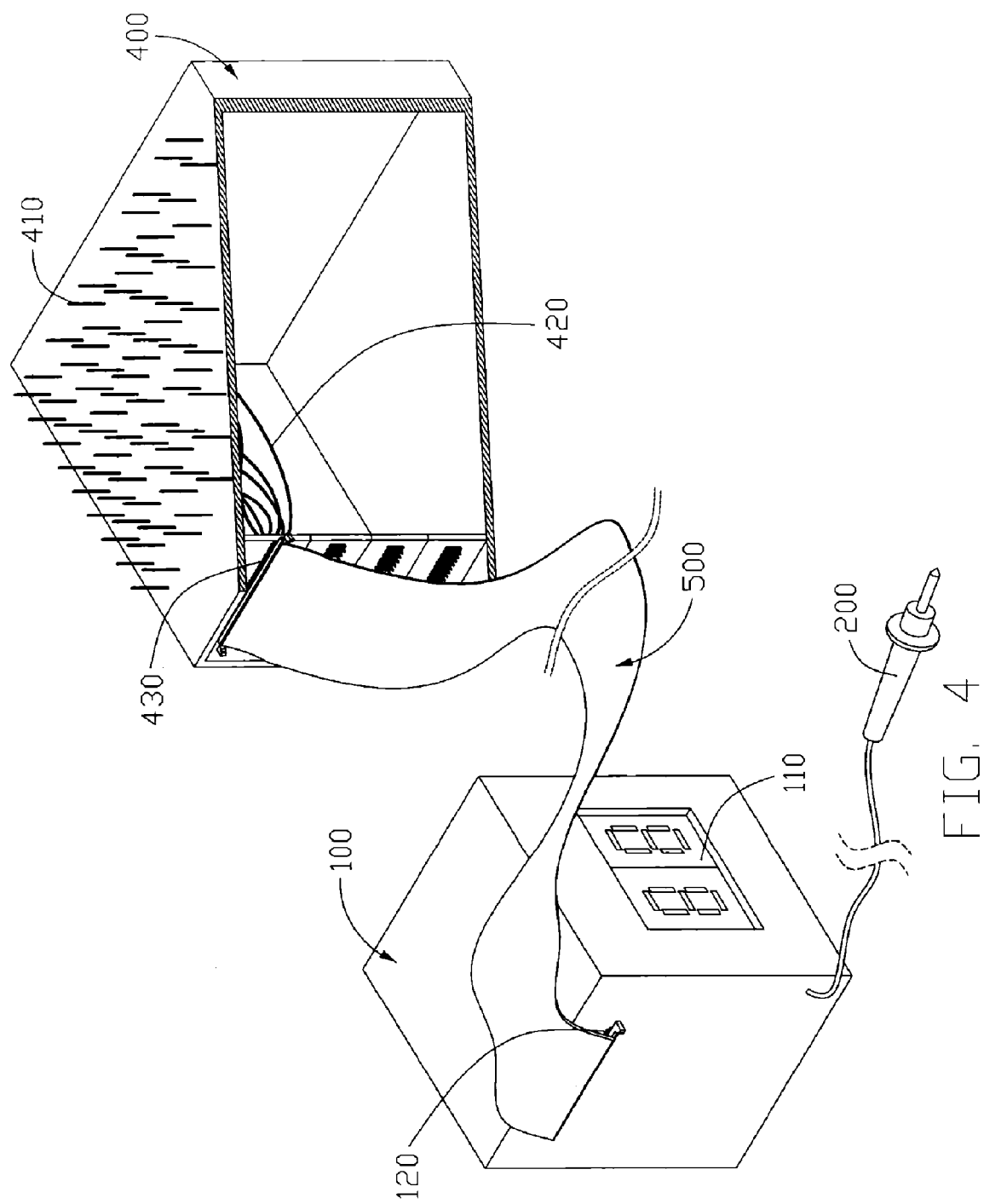
FIG. 4 is a schematic view of the tester of FIG. 1, together with a cable and a ICT bed of nails fixture.

Referring to FIGS. 1 through 3, a tester for an In-Circuit Testing (ICT) bed of nails fixture according with a preferred embodiment of the invention includes a box 100, a probe 200, a power supply Vcc, and a testing circuit 300. A display device 110 and an interface 120 are arranged on an outside of the box 100. The power supply Vcc and the testing circuit 300 are fixed to an inside of the box 100. The interface 120 includes a plurality of pins 121, for example, there are sixty-four pins 121 labeled from J1 to J64 (J[1 . . . 64]) according with sixty-four nails 410 of the bed of nails 400 (FIG. 4) labeled from 1 to 64. The display device 110 includes seven segment digital displays 111, 112. The probe 200 is connected to the tester via a line 210. The probe 200 is arranged on one end of the line 210, and the other end of the line 210 is grounded.

The testing circuit 300 includes a clock pulse circuit 310, counters such as a first up-counter 320 and a second up-counter 330, a scanning circuit 340, and a coding circuit 350. The testing circuit 300 receives voltages from the power supply Vcc. The clock pulse circuit 310 generates a clock pulse sent to the first up-counter 320 and the second up-counter 330. Then the first up-counter 320 and the second up-counter 330 repeatedly and synchronously, count up from 0 to 63. The first up-counter 320 sends a first code to the coding circuit 350. The coding circuit 350 translates the first code to a display signal, and then sends the display signal to the display device 110. The second circuit 320 sends a second code to the scanning circuit 340 to initiate a scanning process. The scanning circuit 340 is connected to the interface 120 for scanning each of the pins 121 of the interface 120. When the scanning circuit 340 finds one of the pins 121 is grounded, the scanning circuit 340 sends an interrupt signal to the first up-counter 320 and the second up-counter 330 at the same time. Then the first up-counter 320 and the second up-counter 330 stop counting, and the display device 110 shows a number according with the grounded one of the pins 121, for example Pin J1 will register as grounded when the probe 200 contacts the nail 1 and a circuit associated with the nail 1 has no opens.

The second up-counter 330 employs a binary counter which has six outputs. The scanning circuit 340 includes a first multiplexer 341 receiving three bits of a signal output by the up-counter 330, and a second multiplexer 342 receiving another three of the signal output by the up-counter 330, and a plurality of relays, for example, there are sixty-four relays labeled from K1 to K64 (K[1 . . . 64]) according with the quantity of the pins 121. The first multiplexer 341 and the second multiplexer 342 each employ an integrated circuit CD4051BMS. The first multiplexer 341 and the second multiplexer 342 both are single eight-channel multiplexers having three binary inputs A, B, and C. The first multiplexer 341 includes eight channels X0, X1, X2, X3, X4, X5, X6 and X7 (X[0 . . . 7]). The second multiplexer 342 includes eight channels Y0, Y1, Y2, Y3, Y4, Y5, Y6 and Y7 (Y[0 . . . 7]). The three binary inputs A, B, and C of the first multiplexer 341 receive the three bits respectively, the three bits corresponding to one of the eight-channels X[0 . . . 7] to be turned on, connecting to a common terminal of the first multiplexer 341. The common terminal of the first multiplexer 341 is connected to the power supply Vcc. The three binary inputs A, B, and C of the second multiplexer 342 receives the other three bits from the first up-counter 320 to select one of the 8 channels Y[0 . . . 7] to be turned on, connecting to a common terminal of the second multiplexer 342. The common terminal of the second multiplexer 342 sends the interrupt signal to the first up-counter 320 and the second up-counter 330 if the common terminal of the second multiplexer 342 is high. One terminal of a coil of each relay K[1 . . . 64] is connected to the power supply Vcc, and an other terminal of the each coil of the relays K[1 . . . 64] is connected to one of the pins 121. Each of the relays K[1 . . . 64] includes a contact c connected to one of the channels X[0. . . 7], and a contact d connected to one of the channels Y[0 . . . 7]. Because each of the first multiplexer 341 and the second multiplexer 342 has eight output channels, there are sixty-four pair combinations of the channels possible. Each pair combination acts as an address allowing a particular relay K[1-64] to form a circuit with the corresponding pin 121 as shown in table 1:

TABLE 1

Relationship of Pins, Channels X[0 ... 7], and Y[0 ... 7], and Relays

| Relays | K1 | K2 | K3 | K4 | ... | K8 | ... | K57 | K58 | K59 | ... | K62 | K63 | K64 |
|---|---|---|---|---|---|---|---|---|---|---|---|---|---|---|
| Channels X[0 ... 7] | X0 | X0 | X0 | X0 | ... | X0 | ... | X7 | X7 | X7 | ... | X7 | X7 | X7 |
| Channels Y[0 ... 7] | Y0 | Y1 | Y2 | Y3 | ... | Y7 | ... | Y0 | Y1 | Y2 | ... | Y5 | Y6 | Y7 |
| Code of Pins | J1 | J2 | J3 | J4 | ... | J8 | | J57 | J58 | J59 | | J62 | J63 | J64 |

In operation, the tester is used for testing the ICT bed of nails fixture 400. The bed of nails fixture 400 includes the nails 410, an interface 430, and a plurality of wires 420. Each of the wires 420 corresponds to each of the nails 410. A flat cable 500 is connected to the interface 120 and the interface 430. The second code generated by the second up-counter 330 includes a six digit binary signal. Three bits of the six digit binary signal are sent to the first multiplexer 341 selecting one of the channels X[0 ... 7] to be activated. Another three bits of the six digit binary signal are sent to the second multiplexer 342 selecting one of the eight channels Y[0 ... 7] to be activated. Then one of the relays K[1 ... 64] corresponding to two activated channels operates. Thus when the second up-counter 330 circularly counts, the relays K[1 ... 64] are activated in turn. If the probe 200 touches one of the nails 410, for example, a nail labeled 2 corresponding to the pin J2, a circuit is formed from the relay K2, the pin J2, the flat cable 500, one of the wires 420 corresponding to the nail 2, the nail 2, and the probe 200, in that order, then to ground. When the relay K2 is activated the circuit will close. Thus, a common terminal of the first multiplexer 341 is connected to a common terminal of the second multiplexer 342. The common terminal of the multiplexer 341 is high due to the common terminal of the multiplexer 342 being connected to the power supply Vcc. Then the first up-counter 320 and the second up-counter 330 receive the interrupt signal from the common terminal of the multiplexer 341 interrupting the circular counting. The number of the nail 2 will be shown on the display device 110. However, if the circuit formed with nail 2 has some problem, such as an open, the display device 110 will not display the number 2. The tester is small enough to be conveniently moved. Thus, testing of the ICT bed of nails fixture may be easily carried out.

Figure 5:
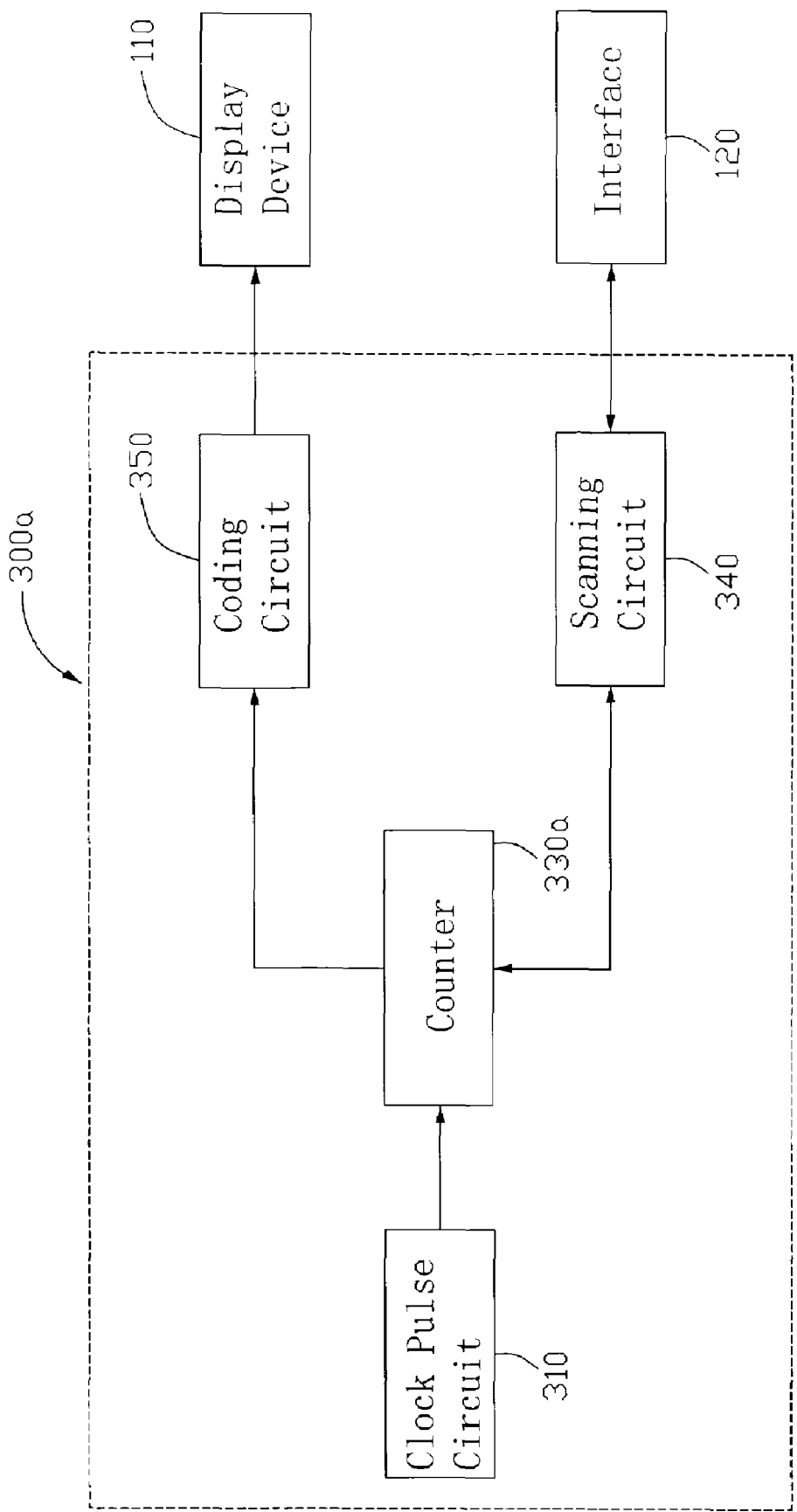
FIG. 5 is a block diagram of a testing circuit of a tester of another preferred embodiment of the present invention.

Referring to FIG. 5, difference between another preferred embodiment of the present invention and the preferred embodiment mentioned is that a testing circuit 300*a* of the another preferred embodiment only employs one counter 330*a* for counting. The counter 330*a* send a code both to the scanning circuit 340 and the coding circuit 350 at the same time.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A tester for testing an In-Circuit Testing (ICT) bed of nails fixture, comprising:
    an interface for connecting a cable, wherein the cable is connected to the ICT bed of nails fixture;
    a probe connected to one of nails of the ICT bed of nails fixture, wherein the probe is grounded;
    a display device for displaying a number according with a pin of the interface, wherein the pin is connected to the probe through the cable and the one of the nails of the ICT bed of nails;
    a testing circuit electrically connected to the display device and the interface for testing continuity of the ICT bed of nails fixture; and
    a power supply providing voltages to the testing circuit.

2. The tester as claimed in claim 1, wherein the testing circuit includes a clock pulse circuit generating a clock pulse, a first counter receiving the clock pulse and sending a first code, a second counter receiving the clock pulse and sending a second code, a scanning circuit receiving the second code and sending an interrupt signal to the first counter and the second counter, and a coding circuit receiving the first code and sending a display signal to the display device, the scanning circuit is connected to the interface for scanning pins of the interface.

3. The tester as claimed in claim 2, wherein the second counter is a six bit binary counter.

4. The tester as claimed in claim 2, wherein the scanning circuit comprises two multiplexers receiving the second code from the second counter, and a plurality of relays controlled by the two multiplexers.

5. The tester as claimed in claim 4, wherein each of the relays comprises a coil, and two contacts, one terminal of the coil is connected to the power supply, the other terminal of the coil is connected to one pin of the interface, one of the two contacts is connected to an output terminal of the first multiplexer, and an other one of the two contacts is connected to an output terminal of the second multiplexer.

6. The tester as claimed in claim 1, further comprising a box, wherein the interface and the display device are mounted on the box, and the testing circuit is mounted in the box.

7. The tester as claimed in claim 6, further comprising a line, wherein the probe is defined and electrically connected to one terminal of the line, and the other terminal of the line is grounded.

8. A testing circuit for testing an In-Circuit Testing (ICT) bed of nails fixture, comprising:
    a clock pulse circuit generating a clock pulse;
    a first counter receiving the clock pulse and sending a first code;
    a second counter receiving the clock pulse and sending a second code;
    a scanning circuit receiving the second code and sending an interrupt signal to the first counter and the second counter, the scanning circuit being connected to an interface for scanning pins of the interface; and
    a coding circuit receiving the first code and sending a display signal to the display device.

9. The testing circuit as claimed in claim 8, wherein the second counter is a six bit binary counter.

10. The testing circuit as claimed in claim 8, wherein the scanning circuit comprises two multiplexers receiving the second code from the second counter, and a plurality of relays controlled by the two multiplexers.

11. The testing circuit as claimed in claim 10, wherein each of the relays comprises a coil, two contacts, one terminal of the coil is connected to the power supply, the other terminal of the coil is connected to one pin of the interface, one of the two contacts is connected to an output terminal of the first multiplexer, and an other one of the two contacts is connected to an output terminal of the second multiplexer.

* * * * *